United States Patent [19]

Garuts

[11] Patent Number: 4,717,837
[45] Date of Patent: Jan. 5, 1988

[54] SAMPLE AND HOLD NETWORK

[75] Inventor: Valdis E. Garuts, Beaverton, Oreg.

[73] Assignee: Tektronix, Inc., Beaverton, Oreg.

[21] Appl. No.: 886,703

[22] Filed: Jul. 18, 1986

[51] Int. Cl.⁴ .............................................. G11C 27/02
[52] U.S. Cl. ..................................... 307/353; 307/358;
307/494; 328/151
[58] Field of Search ............... 307/261, 353, 358, 352,
307/494, 498; 328/151, 156, 158, 160

[56] References Cited
U.S. PATENT DOCUMENTS 3,550,021 12/1970 Freeny ................................. 328/151
3,743,947 7/1973 Fixler et al. ......................... 328/156
3,781,694 12/1973 Lefevre et al. ...................... 328/151

Primary Examiner—John Zazworsky
Attorney, Agent, or Firm—William O. Geny; Robert S. Hulse

[57] ABSTRACT

A sample and hold network samples an input data signal at a periodic rate by differentiating the input data signal and multiplying it in an analog multiplier by a strobe signal, whose spectrum extends to at most twice the highest frequency in the data input signal. The output of the multiplier is combined in a differential amplifier with the input data signal to provide an output having a slope which is zero and also equal to the input data signal at times that are integral multiples of the period of the strobe signal.

3 Claims, 6 Drawing Figures

SAMPLE AND HOLD NETWORK

BACKGROUND OF THE INVENTION

The present invention relates to a sample and hold network for sampling an input data signal and for periodically providing a sample output signal having a value equal to the value of the input data signal for a predetermined period of time.

Conventional sample and hold circuits, which are illustrated in FIG. 1, usually comprise an input amplifier 1 connected to a sampling switch 2 which may comprise a diode bridge, and a strobe pulse generator 3 which gates the input signal into a holding capacitor 4. The strobe pulse generator has a waveform indicated at FIG. 1b. The sampled and held input signal is then made available to a hold buffer amplifier 5 as shown in the waveform diagram of FIG. 1a. There are a number of limitations inherent in the circuit of FIG. 1. First, in order to charge the hold capacitor, the switch resistance must be low and the current capability high. With a low resistance, however, when the switch is off, it presents a capacitive coupling for the input signal which causes errors due to blowby. Also, the bandwidth of the switch, and the hold amplifier following, must be several times the maximum signal bandwidth because of the spectrum generated by the rectangular high frequency, high current strobe pulses. The strobe pulses must be short and of high frequency, but must also have a high enough current to charge the hold capacitor 4 for brief periods of time. This, in turn, leads to the bandwidth problem identified above.

SUMMARY OF THE INVENTION

The above problems are alleviated by the sample and hold network of the present invention which does not require the use of high frequency, high current strobe pulses to sample an input signal. The invention comprises a differentiator responsive to the input data signal and a multiplier for multiplying the differentiated input signal by a strobe signal. The product resulting from the multiplication of the differentiated input data signal by the strobe signal is combined in a differential amplifier with the input data signal to yield a periodically sampled and held version of the input data signal.

Since the strobe signal need not be a series of high frequency, high current pulses, the bandwidth of the network need be at most three times the bandwidth of the data input signal. Another feature of the invention is that the strobe signal may be sinusoidal in nature, thus avoiding the bandwidth problems caused by the frequency spectrum generated by high frequency, high current rectangular pulses. The output of the product of the strobe signal and the differentiated input signal may be combined in a differential amplifier with the data input signal. This results in an output from the differential amplifier whose slope is zero for a predetermined period of time at each multiple of the strobe signal's sinusoidal period. At the time that the output wave form has a slope that is zero, it will have a value which is equal to the input signal and which remains constant for a brief period of time, thereby providing samples of the input data signal.

It is a principal object of this invention to provide a sample and hold network capable of high frequency sampling of an input data signal without the attendant problems caused by high frequency rectangular, high current sampling pulses.

Yet a further object of this invention is to provide a sample and hold network using analog techniques which greatly reduce the expense of the network.

A still further object of this invention is to provide a sample and hold network utilizing components which require a bandwidth capability no greater than three times that of the input data signal.

Still a further object of this invention is to provide a sample and hold network which obviates the need for expensive sampling switches which are susceptible to blowby, and high speed, high current strobe drivers causing transient noise phenomena.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
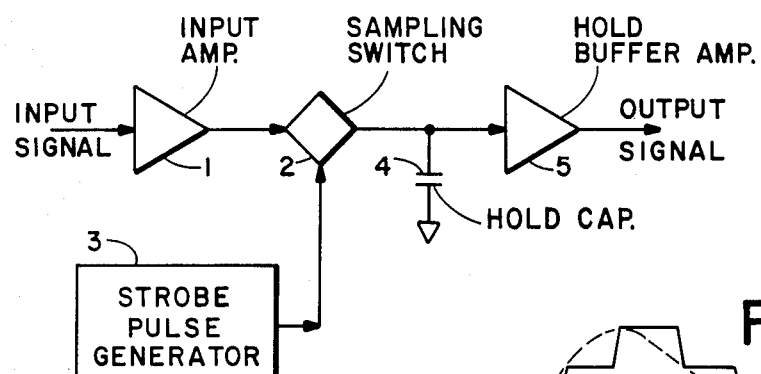
FIG. 1 is a block schematic diagram of a typical prior art sample and hold network.
Figure 1A:
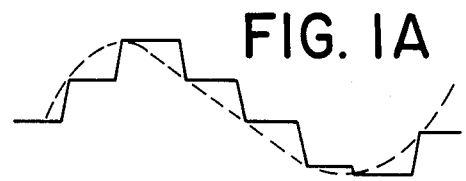
FIG. 1a is wave form diagram illustrating the input data signal and the shape of the sampled and held portions of that signal.
Figure 1B:
FIG. 1b is a wave form diagram of the output of the strobe pulse generator of FIG. 1.
Figure 2:
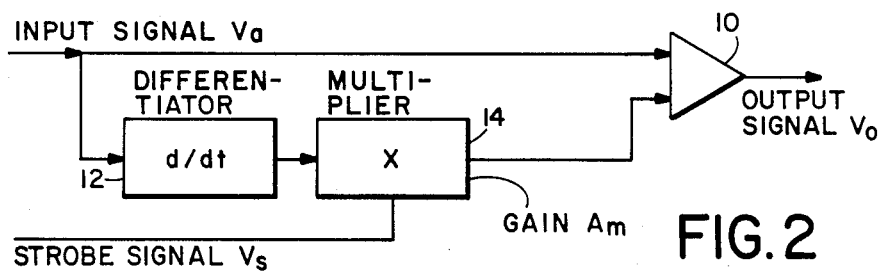
FIG. 2 is a block schematic diagram of a sample and hold network constructed according to the present invention.

An input signal $V_a$ is provided to the positive input of a differential amplifier 10. $V_a$ is, at the same time, differentiated in differentiator 12. The derivative of the input signal is multiplied in multiplier 14 by a sinusoidal strobe signal $V_s$. The product of the strobe signal and the differentiated input signal is then applied to the negative terminal of differential amplier 10. The output signal $V_o$ represents a signal having a value equal to the value of the input data signal for a period of time and the sampling rate is the frequency of the strobe signal.

If the input signal is $V_a$, the output of differentiator 12 is $V'_a = dV_a/dt$. The strobe signal $V_s$ has a frequency $f_s$ and may be of the form $V_{so} \sin(W_s t)$, where $W_s = 2\pi f_s$, that is $V_s$ may be a sinusoidal signal. The sampling rate of the network 10 is equal to the frequency $f_s$ of $V_s$. The period of $V_s$ is $T_s = 2\pi/W_s$. If the gain of the multiplier 14 is $T_s = 2\pi/W_s$. If the gain of the multiplier 14 is $$Am = \frac{1}{W_s V_{so}},$$

then the multiplier output is $$\frac{V_a \sin(W_s t)}{W_s}$$

output $V_o$ is therefore $$V_o = V_a - V'_a \sin(W_s t)/W_s \quad (1)$$

The input signal $V_a$ is sampled at times which are multiples of the period of the strobe signal $T_s$, such that $T_o = n T_s$, where n is an integer. From equation (1) it can be seen that at the sample times $T_o$, $v_o(T_o) = V_a(T_o)$. This is so because differentiating both sides of equation (1) with respect to t yields:

$$\frac{dV_o}{dt} = \frac{dV_a}{dt} - \left[\frac{dV_a}{dt}\cos(W_s t) - \frac{d^2 V_a}{dt^2}\sin(W_s t)/W_s\right]$$

Figure 3:
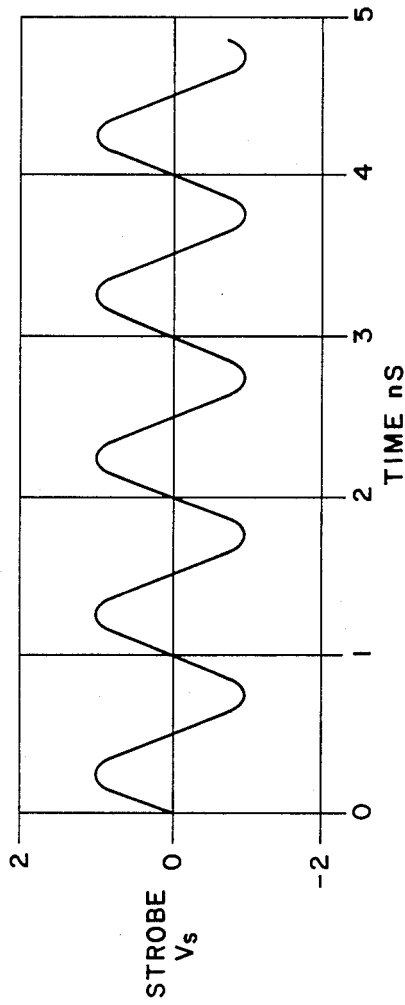
FIG. 3 is a wave form diagram of the strobe signal provided to the multiplier in the network of FIG. 2.
Figure 4:
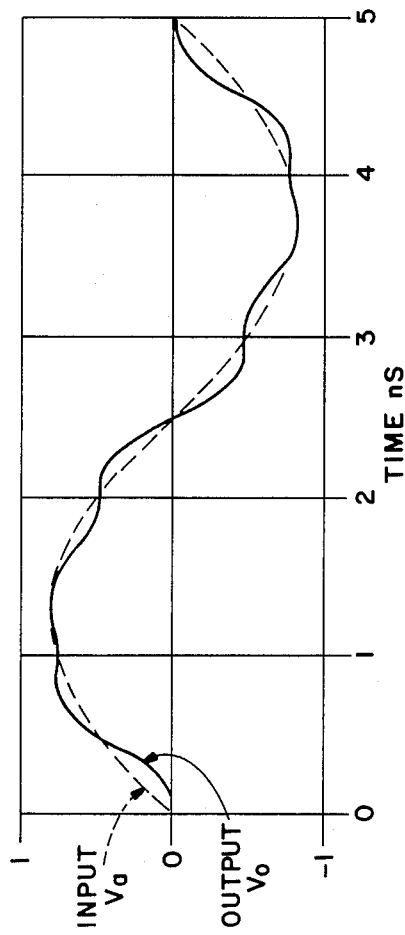
FIG. 4 is a wave form diagram of the input data signal superimposed on the output of the sample and hold network of FIG. 2.

At $T_o = nT_s$ the second term of the right side of the above equation is equal to the first, and therefore cancels it, and the third term is equal to zero, thus reducing the entire right side of the equation to zero. Therefore, at the sample times $T_o$, the slope $dV_o/dt$ of the output signal is zero, as required by the basic function of a sample and hold. A graphic illustration of the foregoing analyses is shown in FIGS. 3 and 4. $V_a$, the input signal, is shown as the dashed line and $V_o$, the output signal, is the solid line. Around each multiple of the strobe frequency (points labelled 1-5 in FIG. 3) the slope of output $V_o$ is small for 20-30% of the strobe period. Thus, at times which correspond to integral multiples of the strobe frequency, an output, $V_o$, is provided which is equal to input signal $V_a$ for a significant portion of the strobe period.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A sample and hold network responsive to an input data signal comprising:
   (a) differentiator means for differentiating said input data signal;
   (b) a multiplier for multiplying the differentiated input signal by a strobe signal without introducing higher order frequency components wherein said strobe signal is generated independently of said input data signal and has a frequency higher than that of the highest frequency in said input data signal; and
   (c) differential output means for combining the output of said multiplier with said data input signal to provide an output wave form whose slope is substantially equal to zero for periods of time which are predetermined fractions of the wavelength of the input data signal corresponding to 20-30% of the period of the strobe signal.

2. The sample and hold network of claim 1 wherein said strobe signal has a sinusoidal wave form.

3. The sample and hold network of claim 1 wherein said differential output means is a differential amplifier for determining the amplitude difference between the output of the multiplier and the input data signal.

* * * * *